US011704028B2

(12) United States Patent
Luo et al.

(10) Patent No.: US 11,704,028 B2
(45) Date of Patent: Jul. 18, 2023

(54) ASYNCHRONOUS POWER LOSS IMPACTED DATA STRUCTURE

(71) Applicant: Micron Technology, Inc., Boise, ID (US)

(72) Inventors: Xiangang Luo, Fremont, CA (US); Ting Luo, Santa Clara, CA (US); Jianmin Huang, San Carlos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/692,683

(22) Filed: Mar. 11, 2022

(65) Prior Publication Data

US 2022/0197517 A1 Jun. 23, 2022

Related U.S. Application Data

(63) Continuation of application No. 16/406,627, filed on May 8, 2019, now Pat. No. 11,275,512.

(60) Provisional application No. 62/668,713, filed on May 8, 2018.

(51) Int. Cl.
*G06F 3/06* (2006.01)
*G06F 11/07* (2006.01)
*G06F 11/14* (2006.01)
*G11C 16/34* (2006.01)
*G06F 1/3206* (2019.01)

(52) U.S. Cl.
CPC .......... *G06F 3/0619* (2013.01); *G06F 1/3206* (2013.01); *G06F 3/0647* (2013.01); *G06F 3/0685* (2013.01); *G06F 11/076* (2013.01); *G06F 11/1471* (2013.01); *G11C 16/3404* (2013.01)

(58) Field of Classification Search
CPC .... G06F 3/0619; G06F 1/3206; G06F 3/0647; G06F 3/0685; G06F 11/076; G06F 11/1471; G06F 1/30; G06F 11/1048; G06F 11/1068; G11C 16/3404; G11C 2029/0411; G11C 5/148; G11C 2207/2227; G11C 5/143; G11C 7/20; G11C 16/10; G11C 16/3459; G11C 29/52; G11C 16/0483; G11C 16/3418; G11C 29/42
See application file for complete search history.

(56) References Cited

U.S. PATENT DOCUMENTS

| | | | | |
|---|---|---|---|---|
| 7,516,267 B2* | 4/2009 | Coulson | .............. | G06F 12/0246 714/2 |
| 7,941,692 B2* | 5/2011 | Royer | ................. | G06F 11/1064 714/42 |
| 9,037,820 B2* | 5/2015 | Ratn | ................... | G06F 11/1446 707/682 |
| 9,202,577 B2* | 12/2015 | Mangold | ................ | G11C 16/16 |
| 9,478,271 B2* | 10/2016 | Chen | ................... | G06F 3/0647 |
| 10,620,870 B2* | 4/2020 | Li | ....................... | G06F 12/0868 |
| 2008/0052446 A1 | 2/2008 | Lasser et al. | | |

(Continued)

*Primary Examiner* — Steve N Nguyen
(74) *Attorney, Agent, or Firm* — Schwegman Lundberg & Woessner, P.A.

(57) ABSTRACT

Systems and methods are disclosed, including rebuilding a logical-to-physical (L2P) data structure of a storage system subsequent to relocating assigned marginal group of memory cells of a memory array of the storage system, such as when resuming operation from a low-power state, including an asynchronous power loss (APL).

20 Claims, 5 Drawing Sheets

(56) References Cited

U.S. PATENT DOCUMENTS

| | | | |
|---|---|---|---|
| 2014/0082259 A1* | 3/2014 | Yeh | G06F 12/0246 |
| | | | 711/103 |
| 2015/0178191 A1* | 6/2015 | Camp | G06F 12/0246 |
| | | | 711/103 |
| 2016/0148694 A1* | 5/2016 | Chang | G11C 16/26 |
| | | | 365/185.03 |
| 2016/0211014 A1* | 7/2016 | Lee | G11C 11/5628 |
| 2018/0150357 A1* | 5/2018 | Shen | G06F 11/1441 |
| 2018/0261281 A1* | 9/2018 | Moschiano | G11C 5/143 |
| 2019/0108090 A1* | 4/2019 | Shen | G11C 11/5628 |
| 2019/0347015 A1 | 11/2019 | Luo et al. | |

* cited by examiner

ASYNCHRONOUS POWER LOSS IMPACTED DATA STRUCTURE

CLAIM OF PRIORITY

This application is a continuation of U.S. application Ser. No. 16/406,627, filed May 8, 2019, which claims the benefit of priority under 35 U.S.C. § 119(e) of U.S. Provisional Patent Application Ser. No. 62/668,713, filed on May 8, 2018, all of which are herein incorporated by reference in their entirety

BACKGROUND

Memory devices are semiconductor circuits that provide electronic storage of data for a host system (e.g., a computer or other electronic device). Memory devices may be volatile or non-volatile. Volatile memory requires power to maintain data, and includes devices such as random-access memory (RAM), static random-access memory (SRAM), dynamic random-access memory (DRAM), or synchronous dynamic random-access memory (SDRAM), among others. Non-volatile memory can retain stored data when not powered, and includes devices such as flash memory, read-only memory (ROM), electrically erasable programmable ROM (EEPROM), erasable programmable ROM (EPROM), resistance variable memory, such as phase change random access memory (PCRAM), resistive random-access memory (RRAM), or magnetoresistive random access memory (MRAM), among others.

A host system can include a host device including a host processor and a first amount of host memory (e.g., main memory, often volatile memory, such as DRAM) to support the host processor, and one or more storage systems (e.g., often non-volatile memory, such as flash memory) that provide additional storage to retain data in addition to or separate from the host memory.

A storage system, such as a solid-state drive (SSD), can include a memory controller and one or more memory devices, including multiple (e.g., multiple) memory dies or logical units (LUNs). In certain examples, each memory die can include multiple memory arrays and peripheral circuitry thereon, such as die logic or a die processor. The memory controller can include interface circuitry configured to communicate with a host device (e.g., the host processor or interface circuitry) through a communication interface (e.g., a bidirectional parallel or serial communication interface). The memory controller can receive commands or operations from the host device in association with memory operations or instructions, such as read or write operations to transfer data (e.g., user data and associated integrity data, such as error data or address data, etc.) between the memory devices and the host device, erase operations to erase data from the memory devices, perform drive management operations (e.g., data migration, garbage collection, block retirement), etc.

Software (e.g., programs), instructions, operating systems (OS), and other data are typically stored on storage systems and accessed by main memory for use by the host processor. Main memory (e.g., RAM) is typically faster, more expensive, and a different type of memory (e.g., volatile) than a majority of the memory devices of the storage system (e.g., non-volatile, such as an SSD, etc.). In addition to the main memory, host systems can include different forms of volatile memory, such as a group of static memory (e.g., a cache, often SRAM), often faster than the main memory, in certain examples, configured to operate at speeds close to or exceeding the speed of the host processor, but with lower density and higher cost.

BRIEF DESCRIPTION OF THE DRAWINGS

The present disclosure is illustrated by way of example and not limitation in the figures of the accompanying drawings, in which like references indicate similar elements.

DETAILED DESCRIPTION

Figure 1:
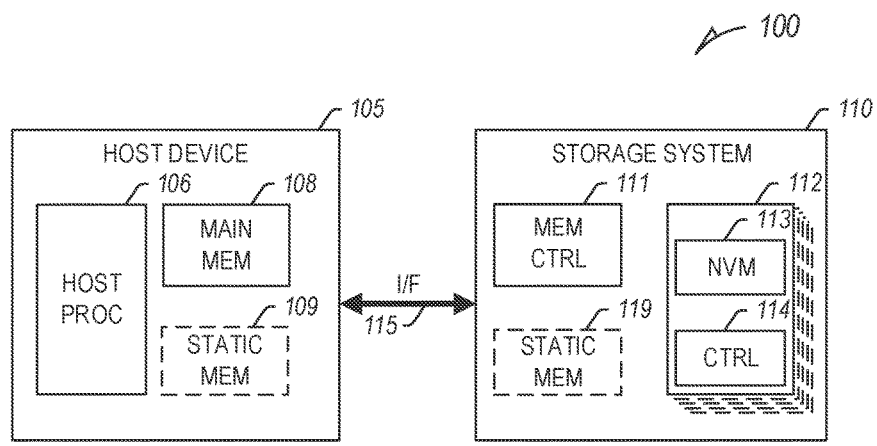
FIG. 1 illustrates an example system including a host device and a storage system.

Aspects of the present disclosure are directed to rebuilding data structures (e.g., maps, tables, etc.) in a storage system, such as when resuming operation from a low-power state (e.g., an "off" state, such as in contrast to an "on" state) including, in a specific example, when resuming operation after an asynchronous power loss (APL). In certain examples, APL can refer to any unexpected or sudden loss of power, shutdown, or reset. Under normal circumstances, such as in response to a command to shut down (or enter sleep or hibernate modes) from a host device, etc., power is not removed from a storage system until the storage system acknowledges that unfinished write operations or saves are complete and addressing information is updated and stored. In certain examples, a synchronization point can be stored in a data structure of the storage system indicating a specific point in one or more data structures where all previous write operations are complete and addressing information has been updated and stored. An APL may lead to data and addressing errors on the storage system, such as subsequent to a stored synchronization point. The presence or lack of a synchronization point is not indicative of all previous operations indicated in the data structure, however, it can be used as a starting point to rebuild one or more data structures.

The present inventors have recognized, among other things, systems and methods to rebuild data structures, such as when resuming operation from a low-power state, comprising determining if a group of memory cells, such as a group of memory cells programmed or erased subsequent to a synchronization point of the storage system, has an error rate above a threshold, and if so, relocating the group of memory cells prior to rebuilding a logical-to-physical (L2P) data structure (e.g., an L2P map, table, etc.) of the storage system.

Modern memory devices, particularly non-volatile memory devices, such as NAND flash devices, etc., frequently relocate data, such as to refresh stored data or otherwise manage data in the memory devices (e.g., garbage collection, wear leveling, drive management, etc.). In certain examples, a logical block address (LBA) of the stored data can remain static, while a physical address (PA) of the stored data may change. The relationship between the LBA and the physical address can be maintained using L2P information in the L2P data structure, typically in volatile memory (e.g., static memory, such as static random-access memory (SRAM), cache, etc.) of the storage system, such as to speed access to the physical address on the storage system given a particular LBA. The L2P information in the L2P data structure is commonly referred to as the flash translation layer (FTL).

When a read command occurs, the L2P data structure can be referenced to locate the requested data. However, the size of the L2P data structure is typically larger than the available volatile memory of the storage system. One or more portions of the L2P data structure (e.g., one or more L2P regions or subregions, etc.) are typically loaded in volatile memory. A miss occurs when requested L2P information is not currently loaded in the volatile memory. In such instances, the storage system (e.g., firmware (FW) of the memory controller, etc.) can free space in the volatile memory (e.g., SRAM) by discarding or flushing to non-volatile memory (e.g., NAND) some L2P information (e.g., an L2P regions or subregions, etc.) and loading the requested L2P information (e.g., an L2P regions or subregions, etc.) from the non-volatile memory (e.g., NAND), adding latency to the read command and impacting system performance.

To improve system performance, such as during read commands or other memory operations, a portion of the L2P information can be stored on a host device, such as in host memory. The host device can request L2P information from the storage system using a read buffer command, receive L2P information from the storage system in response, and manage the L2P information in host memory. The host device can provide the physical address to the storage system with a read command, reducing L2P access time on the storage system to provide the requested information, further reducing device latency and increasing system performance.

If the entire L2P data structure is managed at the host device, a 100% L2P information hit ratio can be attained, but due to new host writes and internal relocation of data (e.g., garbage collection), addresses stored at the host device can become invalid, requiring the L2P information to be updated at the storage system. If the L2P information hit ratio falls below an acceptable threshold, or if a number of L2P misses reaches a threshold, the storage system can notify the host device that the L2P information in host memory should be updated, such as using a flag, a bitmap, one or more bits or bytes of a response, etc., and the host device can request updated L2P information.

In an example, control circuitry of the storage system (e.g., a memory or device controller of the storage system) can be configured to manage portions of the non-volatile memory in one or more regions or sub-regions. L2P regions and sub-regions can be ranges in the logic space. For example, a 64 GB storage system can be divided into 64 1 GB regions. A 1 GB region can be divided into 16 sub-regions of 64 MB. If each LBA is 4 kB of data, a sub-region can be formed by 16,384 consecutive LBA, and a region can be formed by 262,144 consecutive LBA. Such numbers, ranges, and sizes are illustrative, and in other examples, other numbers, ranges, and sizes can be used. Active regions or sub-regions can include regions or sub-regions currently managed by the control circuitry.

The L2P data structure can be rebuilt after an APL using a previous synchronous data point. The storage system stores the L2P data structure, but it cannot write the L2P data structure and received data at the same time (e.g., a write and an array program may not finish at the same time). After an APL, it may be unknown whether the L2P data structure reflects all previously written data, or if all previous writes reflected in a group data structure, recording data operations, were completed before the APL. Accordingly, synchronous data points can be written into the group data structure (e.g., a system block, etc.), and the L2P data structure can be rebuilt from that point. The group data structure can include or be separate from the L2P data structure.

Many storage systems write user data in pages and erase user data in blocks. Each block contains multiple (e.g., hundreds, thousands, etc.) of pages. Further, many storage systems require a page of non-volatile memory to be erased before it can be programmed again. Accordingly, all pages in a block must be ready for erasure (e.g., containing invalid data, having moved valid data, etc.) before the block is erased. In addition, non-volatile memory cells have a specific number of program/erase cycles they can tolerate before they are retired, and erase operations take more time than program operations (e.g., ~50×, etc.), and much more than read operations (e.g., ~500×, etc.). Such ratios are illustrative, not restrictive, and may vary. As used herein, a group of memory cells can include a page of memory cells, or one or more other groups, such as a block, etc.

When information stored in a page requires update, a storage system can mark the page as invalid and write updated information to a new, empty page, updating the L2P information to direct subsequent operations to the new page. The original page may eventually be erased once the remaining pages in the block are marked invalid, the remaining valid data has been moved (e.g., and the L2P information has been updated), or some combination thereof. Similarly, information marked for deletion is often marked invalid, but retained until all information in the block can otherwise be erased.

Storage systems may experience one or more errors during operation. For example, memory cell performance may degrade after repeated program, read, and erase operations. Errors may also be introduced in the operation of the storage system. Reading data from memory cells in a block of memory cells may cause changes to nearby memory cells (e.g., in surrounding blocks or groups of memory cells), an effect known as read disturbance (read disturb). For example, read disturb errors can occur when a pass-through voltage (Vpass) is applied to memory cells near a memory cell that is being read that shifts the distribution of charge in the cells to which it is applied. If the magnitude of the distribution is large enough, a different value can be read from the memory cell than what was stored.

To ensure reliable data storage and recovery, a storage system can have one or more error detection and correction mechanisms, such as by an error correction unit (ECU). For example, memory cells may have Error Correction Codes (ECC) that are generated when the memory cell is written by inputting the value to be stored in the memory device into a mathematical formula to produce an ECC value that is also stored. Later, upon reading the memory cell, the same or complimentary mathematical formula is applied to the value read from the memory cell. The ECC generated at the time the memory cell is written can be compared to the ECC generated at the time the memory cell is read to determine an error. If the ECC generated at the time the memory cell is written does not match the ECC generated at the time the memory cell is read, an error exists. Example ECC processes may include parity checks, Hamming codes, checksums, cyclic redundancy checks (CRCs), cryptographic hashes, block codes, convolutional codes, turbo codes, low-density parity check (LDPC), etc.

Storage systems can implement a variety of error handling mechanisms, hardware or software-based, to correct the value read from the memory cell when an error is detected.

Different error handling mechanisms can target different error conditions. Error conditions can be described with respect to one or more error thresholds. Error thresholds can include a number of detected errors (e.g., bit errors in a group of memory cells), or success or failure of one or more error conditions (e.g., an ECC check, etc.). In an example, read disturb error handling mechanisms target read disturb errors, such as by shifting read voltages to compensate for shifts in charge distribution. Multiple error handling mechanisms may be tried for a given error. Each error handling mechanism may perform different operations and thus may require different amounts of error handling overhead.

In some examples, it may not be evident to the storage system what caused the error, and the storage system may try multiple error handling mechanisms to correct it. The order of such mechanisms can be specified by a predefined error handling sequence. Error handling sequences may be programmed into the device in hardware, software, or a combination of hardware and software at device manufacture time, and may be developed by the manufacturer based upon expected use cases and environments as well as historical expected success rates, latencies, and controller utilization statistics of the various error handling mechanisms.

FIG. 1 illustrates an example system (e.g., a host system) 100 including a host device 105 and a storage system 110 configured to communicate over a communication interface (I/F) 115 (e.g., a bidirectional parallel or serial communication interface). In an example, the communication interface 115 can be referred to as a host interface. The host device 105 can include a host processor 106 (e.g., a host central processing unit (CPU) or other processor or processing circuitry, such as a memory management unit (MMU), interface circuitry, etc.). In certain examples, the host device 105 can include a main memory (MAIN MEM) 108 (e.g., DRAM, etc.) and optionally, a static memory (STATIC MEM) 109, to support operation of the host processor (HOST PROC) 106.

The storage system 110 can include a universal flash storage (UFS) device, an embedded MMC (eMMCT™) device, or one or more other memory devices. For example, if the storage system 110 includes a UFS device, the communication interface 115 can include a serial bidirectional interface, such as defined in one or more Joint Electron Device Engineering Council (JEDEC) standards (e.g., JEDEC standard D223D (JESD223D), commonly referred to as JEDEC UFS Host Controller Interface (UFSHCI) 3.0, etc.). In another example, if the storage system 110 includes an eMMC device, the communication interface 115 can include multiple parallel bidirectional data lines (e.g., DAT[7:0]) and one or more command lines, such as defined in one or more JEDEC standards (e.g., JEDEC standard D84-B51 (JESD84-A51), commonly referred to as JEDEC eMMC standard 5.1, etc.). In other examples, the storage system 110 can include one or more other memory devices, or the communication interface 115 can include one or more other interfaces, depending on the host device 105 and the storage system 110.

The storage system 110 can include a memory controller (MEM CTRL) 111, a non-volatile memory device 112, and, optionally, a limited amount of static memory 119 to support operations of the memory controller 111. The memory controller 111 can receive instructions from the host device 105, and can communicate with the non-volatile memory device 112, such as to transfer data to (e.g., write or erase) or from (e.g., read) one or more of the memory cells of the non-volatile memory device 112.

In an example, the non-volatile memory device 112 can include multiple non-volatile memory devices (e.g., dies or LUNs), such as one or more stacked flash memory devices (e.g., as illustrated with the stacked dashes underneath the non-volatile memory device 112), etc., each including non-volatile memory (NVM) 113 (e.g., one or more groups of non-volatile memory cells) and a device controller (CTRL) 114 or other periphery circuitry thereon (e.g., device logic, etc.), and controlled by the memory controller 111 over an internal storage-system communication interface (e.g., an Open NAND Flash Interface (ONFI) bus, etc.) separate from the communication interface 115. Control circuitry, as used herein, can refer to one or more of the memory controller 111, the device controller 114, or other periphery circuitry in the storage system 110, the non-volatile memory device 112, etc.

The non-volatile memory 113 (e.g., one or more 3D NAND architecture semiconductor memory arrays) can include multiple memory cells arranged in, for example, multiple devices, planes, blocks, physical pages. A single-level cell (SLC) can represent one bit of data per cell in one of two programmed states (e.g., 1 or 0). A multi-level cell (MLC) can represent two or more bits of data per cell in multiple programmed states (e.g., $2^n$, where n is the number of bits of data). In certain examples, MLC can refer to a memory cell that can store two bits of data in one of 4 programmed states. A triple-level cell (TLC) can represent three bits of data per cell in one of 8 programmed states. A quad-level cell (QLC) can represent four bits of data per cell in one of 16 programmed states. In other examples, MLC can refer to any memory cell that can store more than one bit of data per cell, including TLC and QLC, etc. As one example, a TLC memory device can include 18,592 bytes (B) of data per page, 1536 pages per block, 548 blocks per plane, and 4 planes per device. As another example, an MLC memory device can include 18,592 bytes (B) of data per page, 1024 pages per block, 548 blocks per plane, and 4 planes per device, but with less (e.g., half) required write time and more (e.g., double) the program/erase (P/E) cycles as a corresponding TLC memory device. Other examples can include other numbers or arrangements.

Each of the host device 105 and the storage system 110 can include a number of receiver, buffer, driver, or other interface circuits (e.g., data control units, sampling circuits, or other intermedia circuits) configured to send, receive, or process data or signals to be communicated over the communication interface 115. Control circuitry of the storage system 110 can include, among other things, circuitry or firmware, such as a number of components or integrated circuits, a memory manager to provide one or more memory management functions (e.g., wear leveling, garbage collection, error counts, block age, erase count, etc.). In an example, control circuitry of the storage system can maintain L2P information in one or more management tables, rebuild L2P data structures, maintain group data structures comprising data operations, and determine a PU status for one or more groups of memory cells of the storage system 110.

The memory manager can include, among other things, circuitry or firmware, such as a number of components or integrated circuits associated with various memory management functions, including, among other functions, wear leveling (e.g., garbage collection or reclamation), error detection or correction, block retirement, or one or more other memory management functions. The memory manager can parse or format host commands (e.g., commands received from the host device 105) into device commands (e.g., commands associated with operation of a memory array, etc.), or generate device commands (e.g., to accomplish various memory management functions) for the device controller 114 or one or more other components of the storage system 110.

The memory manager can include a set of management tables configured to maintain various information associated with one or more component of the storage system 110 (e.g., various information associated with a memory array or one or more memory cells coupled to the memory controller 111). For example, the management tables can include information regarding block age, block erase count, error history, or one or more error counts (e.g., a write operation error count, a read bit error count, a read operation error count, an erase error count, etc.) for one or more blocks of memory cells coupled to the memory controller 111. In certain examples, if the number of detected errors for one or more of the error counts is above a threshold, the bit error can be referred to as an uncorrectable bit error. The management tables can maintain a count of correctable or uncorrectable bit errors, among other things. In an example, the management tables can include translation tables, L2P information, the group data structure, etc.

Control circuitry of the storage system 110 can detect or correct errors associated with writing data to or reading data from one or more memory cells of the non-volatile memory device 112. Control circuitry can actively detect and recover from error occurrences (e.g., bit errors, operation errors, etc.) associated with various operations or storage of data, while maintaining integrity of the data transferred between the host device 105 and the storage system 110, or maintaining integrity of stored data (e.g., using redundant array of independent disks (RAID) storage, etc.), and can remove (e.g., retire) failing memory resources (e.g., memory cells, memory arrays, pages, blocks, etc.) to prevent future errors.

Control circuitry can calculate an ECC upon writing a value to the non-volatile memory device 112 and store this value (e.g., in a different location on the non-volatile memory device 112). Upon reading a value from the non-volatile memory device 112, control circuitry can calculate an ECC value for the value read and compare that to the stored ECC value. If the ECC values do not match, control circuitry can determine that an error has occurred.

Control circuitry can track error handling metrics of one or more ECC processes. Examples include one or more of the number of times the error handling mechanisms are needed (e.g., EH_COUNTER), the number of times each particular error handling metric is utilized, the number of times each error handling mechanism successfully fixes an error, a latency of each error handling mechanism, and the like. In certain examples, control circuitry can include a dynamic error handling component (e.g., circuitry, processor, dedicated logic, programmable logic, firmware, etc.) to perform the operations described herein, such as one or more scan or fold operations. In some implementations, the error handling component can reorder error handling sequences during device usage based upon one more observed error handling metrics. In certain examples, the dynamic error handling component can update the order of the error handling mechanisms.

Figure 2:
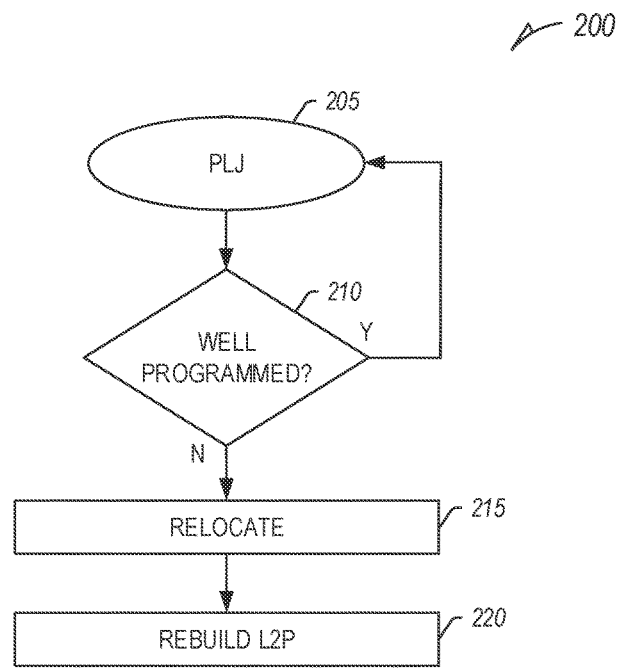
FIGS. 2-3 illustrate example methods of performing power loss judgment (PU) for a storage system.

FIG. 2 illustrates an example power loss judgment (PU) method 200 for a storage system comprising control circuitry and a memory array having multiple groups of memory cells. In one example, when resuming operation from a low-power state, such as after or in response to an asynchronous power loss (APL), control circuitry can be configured to rebuild an L2P data structure for data stored in the memory array.

In an example, control circuitry of a storage system can scan one or more groups of memory cells (e.g., pages, blocks, etc.) of a memory array to determine a PU status of the one or more groups, such as prior to rebuilding an L2P data structure after an APL. In an example, a threshold test can be performed on one or more bits of the one or more groups of memory cells, or one or more other error detection processes can be can be performed to determine the PLJ status of the one or more groups, such as in contrast to information stored about the group of memory cells in a group data structure (e.g., a write or erase status, information from one or more ECC processes, etc.).

The PLJ statuses can include, in certain examples: (1) a truly erase page; (2) a fake erase page; (3) a well programmed page; (4) a marginal page; and (5) a fake programmed page. In an example, the PLJ categories may consist of those five PU categories. In other examples, the PLJ categories may include different combinations or permutations of those or other PU categories, such as depending on one or more threshold tests of the memory cells, etc. Although referred to above with respect to pages, in other examples, the PLJ statuses can refer to other groups of memory cells (e.g., blocks, etc.).

A truly erase page can include a page that has been erased and is ready for new data to be written. A well programmed page can include a programmed page of valid and stable data (e.g., low error rate, etc.). A marginal page can include a programmed page with valid but possibly unstable data (e.g., a high error rate that is currently correctable by ECC processes, but may not be correctable in the future, etc.). In certain examples, stable data can refer to data written prior to an APL, and the data passes ECC processes; and unstable data can refer to data that has errors that are currently correctable by ECC processes but has a high risk of not passing ECC processes or may not be correctable by ECC processes in the future (e.g., overlapping distributions, high error rate in contrast to other pages, etc.). In this context, "high" can refer to a number of errors near (e.g., within 20%-50% of, etc.) a maximum error threshold, a time to correct a detected error near (e.g., within 20%-50% of, etc.) a maximum time/cost threshold, etc.; and "low" can refer to a number of errors below (e.g., less than 50%, etc.) of a maximum error threshold, a time to correct a detected error below (e.g., less than 50%, etc.) a maximum time/cost threshold, etc. In an example, the maximum error threshold can be the threshold at which the errors are uncorrectable by ECC processes of the control circuitry. In other examples, the maximum error threshold can be set below the threshold at which errors are uncorrectable by ECC processes of the control circuitry (e.g., outside the capabilities of the control circuitry, outside an ECC setting, etc.), but represent a maximum desired cost of time (e.g., storage system latency, etc.) or resources of the storage system to correct such errors (e.g., received from a user, set by a manufacturer, etc.). In an example, the "low" error rate can be referred to with respect to a number of correctable errors below a stable threshold lower than the maximum error threshold (e.g., 50% of a maximum error threshold, etc.).

A fake erase page can include an erase page, or a page marked for erase, where the erase operation was started but not completed, such as an erase operation interrupted by an APL, etc. A fake programmed page can include a programmed page, or a paged marked for programming, that cannot be read or recovered by ECC processes, including pages where a programming operation was started but interrupted by an APL, such that the programming operation is incomplete. In operation, dummy data can be padded into fake erase or fake programmed pages, or the data contained therein can be discarded or marked invalid for subsequent erase, etc.

In a first example, the storage system can rebuild the L2P data structure prior to relocating determined marginal groups of memory cells, such as to avoid scanning fake erase and fake programmed pages, which can be time consuming. One of the five PLJ categories can be assigned to each group of memory cells (e.g., each page of memory cells, etc.) in the group data structure (e.g., a page bitmap, etc.) programmed or erased subsequent to the previous synchronization point, or if no synchronization point is stored or recorded, to each group of memory cells in the group data structure. The L2P data structure (e.g., an L2P table comprising a PA for each logical unit $4k$) can be rebuilt by scanning the metadata of the data block that stores the LBA information. A synchronization point can be added after rebuilding all data structures, reducing subsequent rebuild costs (e.g., from seconds to milliseconds, etc.), and determined marginal pages can be relocated, re-writing marginal page data, in certain examples, after error correction, improving data integrity, voltage distribution, etc.

Determining PLJ for marginal pages can be challenging (e.g., due to random error bits, temperature data, data retention, etc.), and in certain examples, time consuming. For example, after back-to-back APL, relocating marginal pages may involve scanning a large number of fake erase or fake programmed pages, increasing latency and pushing the rebuild time beyond many system requirements. The present inventors have recognized, among other things, that it can be advantageous to alter the marginal page check, such as in contrast to the first example, moving the marginal page check into the marginal page relocation step, prior to rebuilding the L2P data structure. In other examples, the marginal page check can be changed to a not-well-programmed page check, in certain examples reducing costs and system latency.

At 205, control circuitry can determine PLJ for a group of memory cells selected from a group data structure, such as when resuming operation from a low-power state, including after or in response to an APL, etc. Control circuitry can be configured to maintain a relationship between a logical block address (LBA) of data stored on a storage system and a physical address (PA) of the data stored on the storage system in an L2P data structure, and to maintain a status of multiple groups of memory cells of the memory array in a group data structure (e.g., a system table, a page bitmap, etc.) including, for example, a list of data operations on the storage system or a status of individual groups of memory cells of the storage system, etc. In certain examples, control circuitry can be configured to store a synchronization point, indicating a specific point in one or more data structures where all previous write operations are complete and addressing information has been updated and stored. A previous stored synchronization point can be used as a starting point, or a lower boundary, to rebuild the L2P data structure, such as after or in response to an APL, etc.

In an example, PU can be determined for one or more groups of memory cells, such as a last written group of memory cells stored in the group data structure, starting after a stored synchronization point of the group data structure, or one or more groups in between the last written group and the synchronization point. In an example, if there is no synchronization point, PLJ can be determined for the last written group, and in certain examples, back through the stored operations in the group data structure until a well programmed group of memory cells is determined. In other examples, PU can be determined from the synchronization point forward until a marginal group of memory cells, a fake programmed group of memory cells, or a fake erase group of memory cells is determined.

At 210, control circuitry can determine if the group of memory cells is well programmed. A group of memory cells is well programmed if it has valid and stable data (e.g., with a low error rate, such as below a stable threshold, etc.). When stepping through the group data structure, if the group of memory cells is well programmed, process can proceed to the next group to determine if it is well programmed, etc. The direction of progress can depend on whether or not PLJ determination starts at or near a previous synchronization point or a last written group of memory cells. In an example, any group of memory cells that is not a well programmed group of memory cells (or in certain examples a truly erase group of memory cells) can be assigned as a marginal group of memory cells (e.g., marked in a data structure, such as a group data structure, metadata, etc.). In certain examples, the method 200 does not perform a traditional marginal group of memory cells determination, but instead determines whether or not the group of memory cells is well programmed, or not well programmed (e.g., including marginal groups of memory cells, fake erase groups of memory cells, and fake program groups of memory cells). In an example, not well programmed groups of memory cells can have an error rate above a stable threshold, in certain examples, without determining if the data in the groups of memory cells is correctable (e.g., through one or more ECC processes, etc.) or above or below a maximum error threshold separate from the stable threshold (e.g., to distinguish between a marginal group of memory cells or a fake programmed group of memory cells, etc.).

At 215, control circuitry can relocate assigned marginal groups of memory cells, such as into a truly erase group of memory cells, or one or more other groups of memory cells ready to receive new data. In an example, marginal groups of memory cells can be pushed into a relocation data structure (e.g., a first-in-first-out (FIFO) register, table, etc.), and the relocation data structure can be used to relocate the marginal groups of memory cells. During relocation, valid units of data can be relocated, and unrecoverable or invalid units of data can be discarded. The assigned marginal groups can be processed as individual groups, such that each group is a unit, as one or more units comprising one or more groups, or as a single unit comprising all assigned marginal groups. Entries in the relocation data structure can be cleared as units are relocated, and the relocation data structure can be cleared once all units are either relocated or discarded. In certain examples, in storage systems having multiple non-volatile memory devices (e.g., dies or LUNs), each having separate device controllers, relocation can be distributed such as to leverage control circuit processing capacity, such as to determine unit validity or invalidity, etc.

At 220, after relocating the assigned marginal groups of memory cells, control circuitry can rebuild the L2P data structure. In one example, if the last written group of memory cells is not a well programmed group of memory cells, the last written group of memory cells can be assigned as marginal. All groups between a previous synchronization point and the group previous to the assigned marginal group can be marked valid. The assigned marginal group (and subsequent groups) can be relocated, such as to a truly erase group, storing valid data and discarding invalid or uncorrectable data. The L2P data structure can then be rebuilt and stored, and a new synchronization point can be stored, such as in the group data structure.

In an example, when resuming operation, it can be assumed that an APL has occurred. In an example, if there is no relocation data structure (or a clear relocation data structure with no entries), PU can be performed from the last synchronization point and the data structures can be rebuilt such as described above. If there is a relocation data structure with entries, the next start page (or the next location control circuitry would write data) can be checked to determine previous valid data writes, the last written group of memory cells can be determined, and PLJ can be performed and data structures can be rebuilt as described above. If is no relocation data structure (or a clear relocation data structure with no entries) and no previous synchronization point, the group data structure can be scanned, and PLJ can be performed and the data structures can be rebuilt such as described above. For each of the above, after the data structures are rebuilt, a new synchronization point can be determined and stored.

Figure 3:
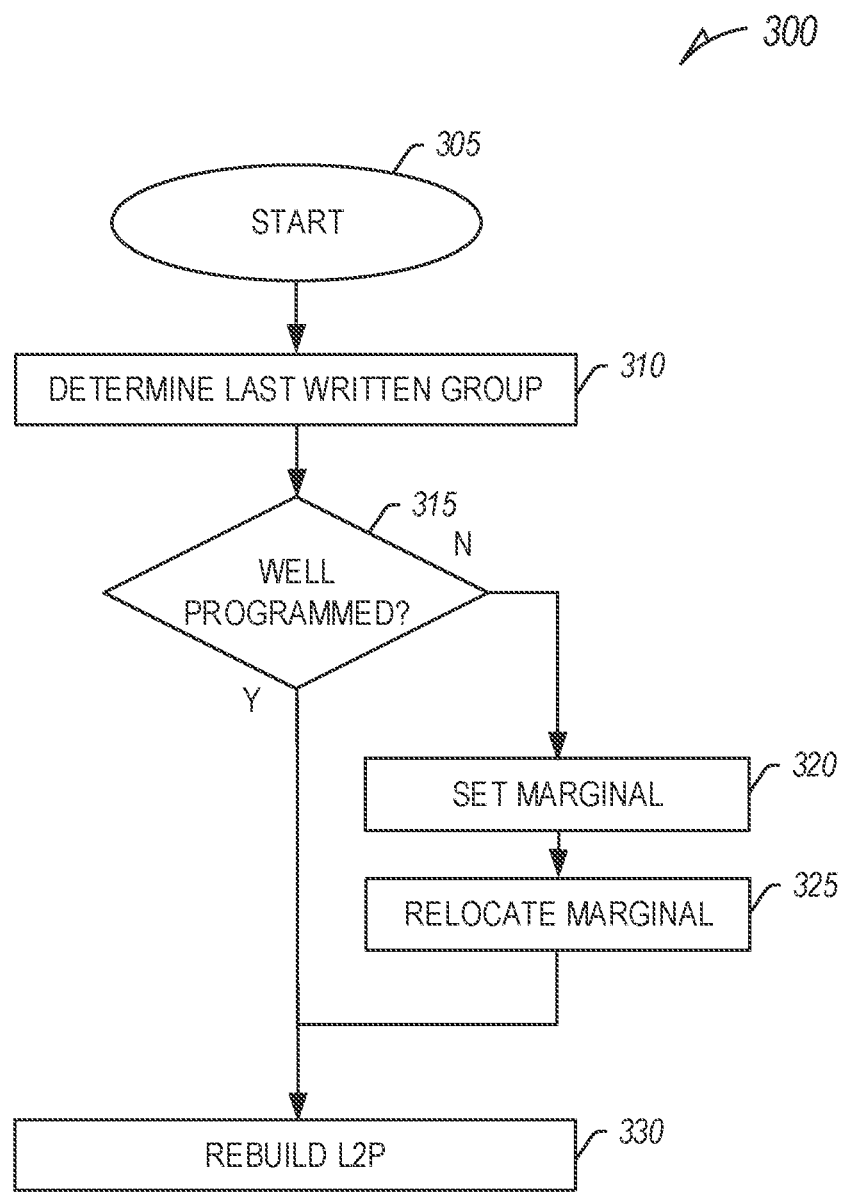

FIG. 3 illustrates an example power loss judgment (PU) method 300 for a storage system comprising control circuitry and a memory array having multiple groups of memory cells. At 305, the method 300 can start as control circuitry of a storage system resumes operation from a low-power state, such as after or in response to an asynchronous power loss (APL). At 310, control circuitry can determine a last written group of memory cells, such as by scanning a group data structure.

At 315, if the last written group of memory cells is a well programmed group of memory cells (e.g., having an error rate below a stable threshold), the last written group can be marked as valid in a data structure, and an L2P data structure can be rebuilt at 330. In certain examples, all previously written groups of memory cells can be marked as valid, such as between the last written group and a synchronization point, or if there is no synchronization point, all previously written groups of memory cells, etc.

If, at 315, the last written group of memory cells is not a well programmed group of memory cells (e.g., having an error rate above a stable threshold), the group can be assigned as a marginal group of memory cells at 320. At 325, the assigned marginal group of memory cells can be relocated, such as to a truly erase group of memory cells or one or more other groups of memory cells ready to receive and store new data. In one example, following relocation of the assigned marginal group of memory cells, the L2P data structure can be rebuilt at 330.

In other example, after determining that the last written group of memory cells is not well programmed at 315, and assigning the last written group of memory cells as a marginal group of memory cells at 320, control circuitry can determine whether one or more previous groups of data cells are well programmed groups of memory cells, in certain examples, starting at the group of memory cells written prior to the last written group of memory cells, and preceding back until a well programmed group of memory cells (e.g., or, in certain examples, a truly erase group of memory cells) is determined. Assigned marginal groups of memory cells can be added to a relocation data structure, and relocated, at 325, such as described herein, including, in certain examples, in a first-in, first-out relocation process.

At 330, the L2P data structure can be rebuilt after relocating any assigned marginal groups of memory cells. Once the L2P data structure is rebuilt, a subsequent synchronization point can be determined and stored for future use or reference. In operation, the L2P data structure and synchronization point can be updated as desired.

Figure 4:
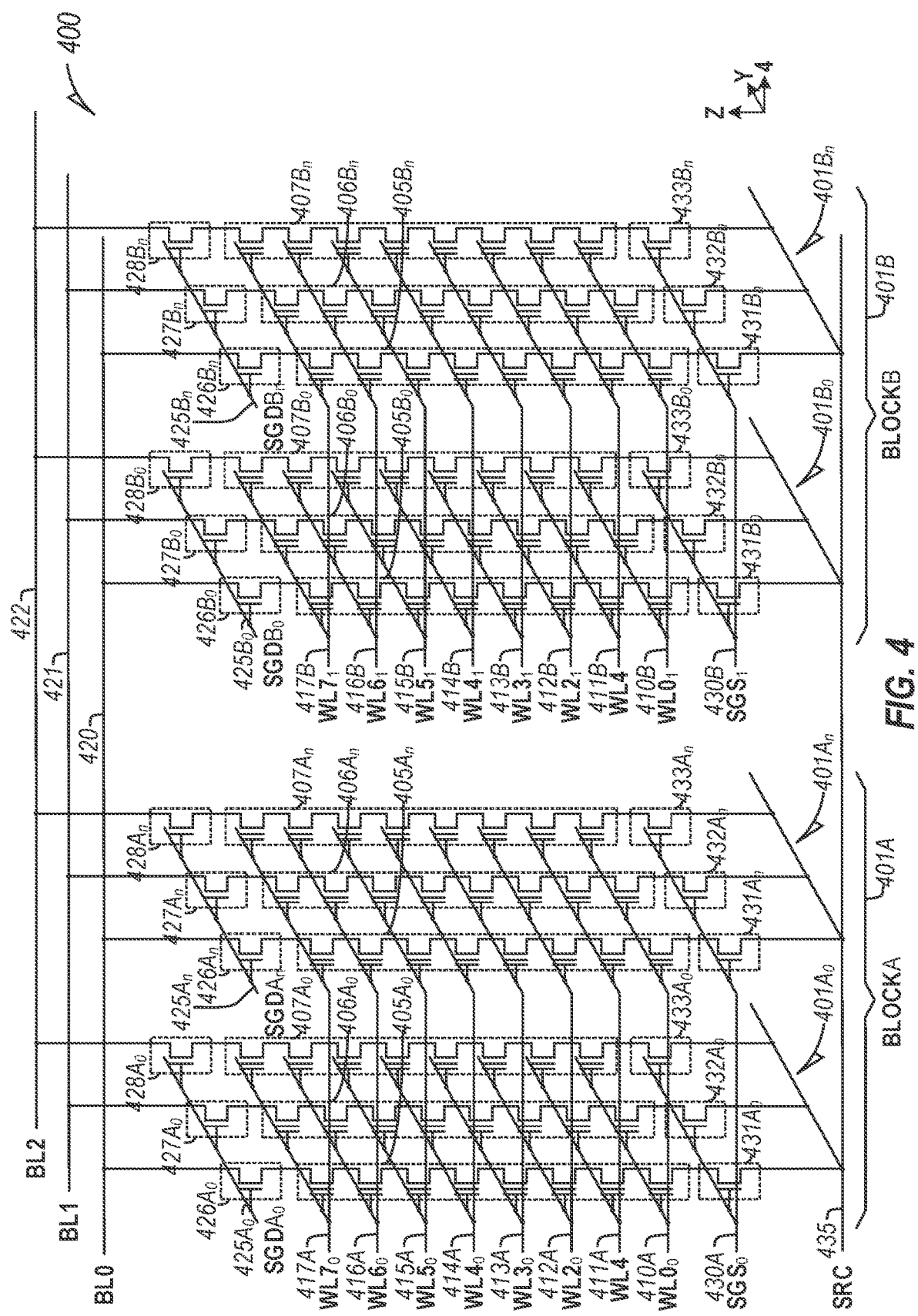
FIG. 4 illustrates an example schematic diagram of a 3D NAND architecture semiconductor memory array.

FIG. 4 illustrates an example schematic diagram of a 3D NAND architecture semiconductor memory array 400 including multiple groups of memory cells. In an example, the multiple groups can include multiple strings of memory cells (e.g., first-third $A_0$ memory strings $405A_0$-$407A_0$, first-third $A_n$ memory strings $405A_n$-$407A_n$, first-third $B_0$ memory strings $405B_0$-$407B_0$, first-third $B_n$ memory strings $405B_n$-$407B_n$, etc.), organized in blocks (e.g., block A 401A, block B 401B, etc.) and sub-blocks (e.g., sub-block $A_0$ 401$A_0$, sub-block $A_n$ 401$A_n$, sub-block $B_0$ 401$B_0$, sub-block $B_n$ 401$B_n$, etc.). The memory array 400 represents a portion of a greater number of similar structures that would typically be found in a block, device, or other unit of a memory device or storage system.

Each string of memory cells includes multiple tiers of storage transistors (e.g., floating gate, replacement gate, charge trapping structures, etc.) stacked in the Z direction, source to drain, between a source line (SRC) 435 or a source-side select gate (SGS) (e.g., first-third $A_0$ SGS 431$A_0$-433$A_0$, first-third $A_n$ SGS 431$A_n$-433$A_n$, first-third $B_0$ SGS 431$B_0$-433$B_0$, first-third $B_n$ SGS 431$B_n$-433$B_n$, etc.) and a drain-side select gate (SGD) (e.g., first-third $A_0$ SGD 426$A_0$-428$A_0$, first-third $A_n$ SGD 426$A_n$-428$A_n$, first-third $B_0$ SGD 426$B_0$-428$B_0$, first-third $B_n$ SGD 426$B_n$-428$B_n$, etc.). Each string of memory cells in the 3D memory array can be arranged along the X direction as data lines (e.g., bit lines (BL) BL0-BL3 420-422), and along the Y direction as physical pages.

Within a physical page, each tier represents a row of memory cells, and each string of memory cells represents a column. A sub-block can include one or more physical pages. A block can include multiple sub-blocks (or physical pages) (e.g., 128, 256, 384, etc.). Although illustrated herein as having two blocks, each block having two sub-blocks, each sub-block having a single physical page, each physical page having three strings of memory cells, and each string having 8 tiers of memory cells, in other examples, the memory array 400 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the storage transistors (e.g., select gates, data lines, etc.), as desired.

Each memory cell in the memory array 400 includes a control gate (CG) coupled to (e.g., electrically or otherwise operatively connected to) an access line (e.g., word lines (WL) WL$0_0$-WL$7_0$ 410A-417A, WL01-WL71 410B-417B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, first-third $A_0$ SGD 426$A_0$-428$A_0$ can be accessed using an $A_0$ SGD line SGDA$_0$ 425$A_0$, first-third $A_n$ SGD 426$A_n$-428$A_n$ can be accessed using an $A_n$ SGD line SGDA$_n$ 425$A_n$, first-third $B_0$ SGD 426$B_0$-428$B_0$ can be accessed using a $B_0$ SGD line SGDB$_0$ 425$B_0$, and first-third $B_n$ SGD 426$B_n$-428$B_n$ can be accessed using a $B_n$ SGD line SGDB$_n$ 425$B_n$. First-third $A_0$ SGS 431$A_0$-433$A_0$ and first-third $A_n$ SGS 431$A_n$-433$A_n$ can be accessed using a gate select line SGS$_0$ 430A, and first-third $B_0$ SGS 431$B_0$-433$B_0$ and first-third $B_n$ SGS 431$B_n$-433$B_n$ can be accessed using a gate select line SGS$_1$ 430B.

In an example, the memory array 400 can include multiple levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

In a NAND architecture semiconductor memory array, the state of a selected memory cell can be accessed by sensing a current or voltage variation associated with a particular data line containing the selected memory cell. The memory array 400 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

In operation, data is typically written to or read from the storage system in pages and erased in blocks. However, one or more memory operations (e.g., read, write, erase, etc.) can be performed on larger or smaller groups of memory cells, as desired. For example, a partial update of tagged data from an offload unit can be collected during data migration or garbage collection to ensure it was re-written efficiently. The data transfer size of a memory device is typically referred to as a page, whereas the data transfer size of a host device is typically referred to as a sector. Although a page of data can include multiple bytes of user data (e.g., a data payload including multiple sectors of data) and its corresponding metadata, the size of the page often refers only to the number of bytes used to store the user data. As an example, a page of data having a page size of 4 kB may include 4 kB of user data (e.g., 8 sectors assuming a sector size of 512 B) as well as multiple bytes (e.g., 32 B, 54 B, 224 B, etc.) of auxiliary or metadata corresponding to the user data, such as integrity data (e.g., error detecting or correcting code data), address data (e.g., logical address data, etc.), or other metadata associated with the user data.

To program or write data to a memory cell, a programming voltage (Vpgm) (e.g., one or more programming pulses, etc.) can be applied to selected word lines (e.g., $WL4_0$), and thus, to a control gate of each memory cell coupled to the selected word lines. Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as $WL4_0$, a pass voltage of 10V can be applied to one or more other word lines, such as $WL3_0$, $WL5_0$, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to $WL4_0$, a pass voltage of 10V can be applied to $WL3_0$ and $WL5_0$, a pass voltage of 8V can be applied to $WL2_0$ and $WL6_0$, a pass voltage of 7V can be applied to $WL1_0$ and $WL7_0$, etc. In other examples, the pass voltages, or number of word lines, etc., can be higher or lower, or more or less.

Data is often stored arbitrarily on the storage system as small units. Even if accessed as a single unit, data can be received in small, random 4-16 k single file reads (e.g., 60%-80% of operations are smaller than 16 k). It is difficult for a user and even kernel applications to indicate that data should be stored as one sequential cohesive unit. File systems are typically designed to optimize space usage, and not sequential retrieval space. Sense amplifiers can be coupled to one or more of the data lines (e.g., first, second, or third bit lines (BL0-BL2) 420-422), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

Figure 5:
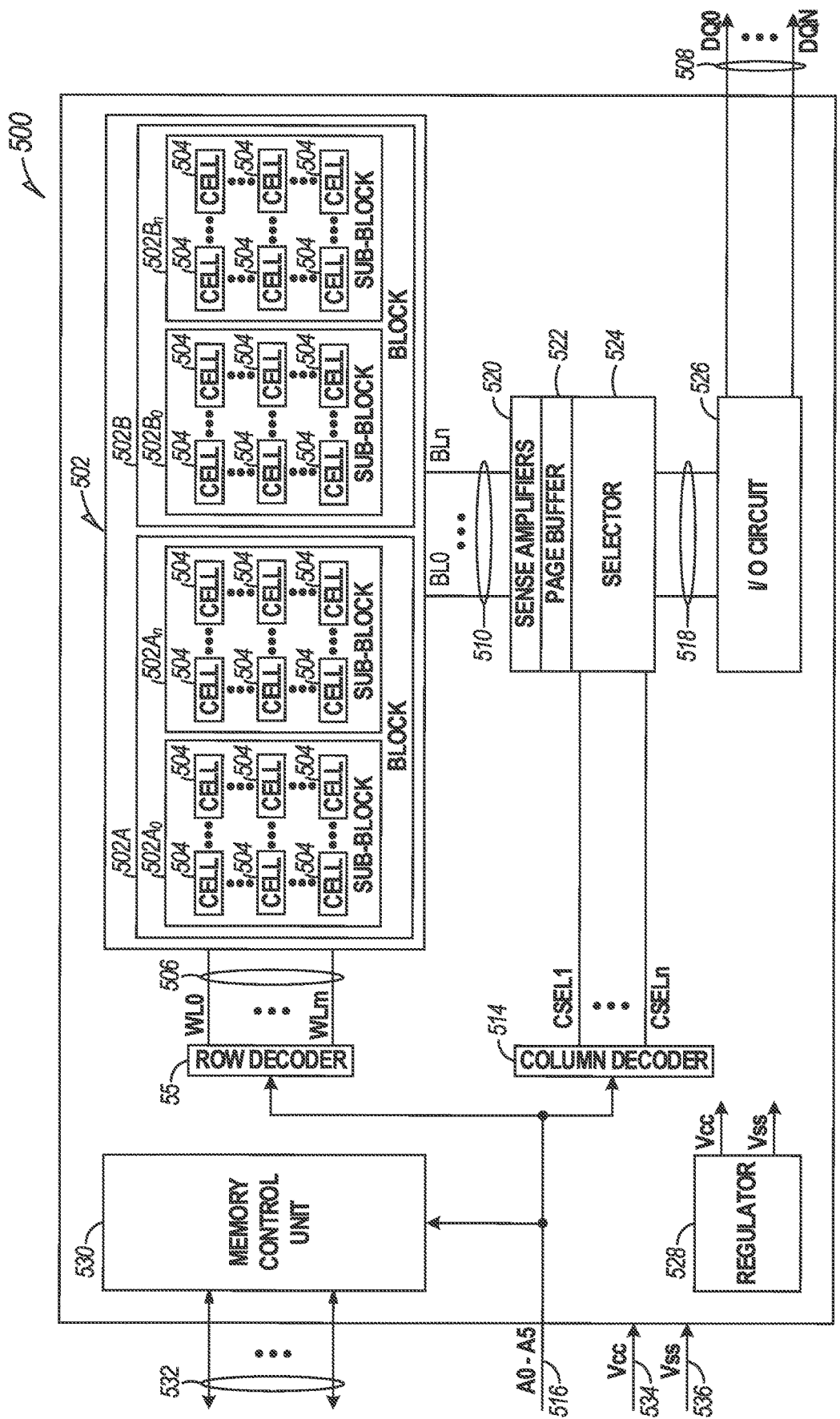
FIG. 5 illustrates an example block diagram of a memory device.

FIG. 5 illustrates an example block diagram of a storage system 500 including a memory array 502 having a plurality of memory cells 504, and one or more circuits or components to provide communication with, or perform one or more memory operations on, the memory array 502. Although shown with a single memory array 502, in other examples, one or more additional memory arrays, dies, or LUNs can be included herein. In certain examples, in a storage system having multiple dies or LUNs, the storage system 500 can represent a block diagram of circuits and components for each die or LUN. The storage system 500 can include a row decoder 512, a column decoder 514, sense amplifiers 520, a page buffer 522, a selector 524, an input/output (I/O) circuit 526, and a memory control unit 530.

The memory cells 504 of the memory array 502 can be arranged in blocks, such as first and second blocks 502A, 502B. Each block can include sub-blocks. For example, the first block 502A can include first and second sub-blocks $502A_0$, $502A_n$, and the second block 502B can include first and second sub-blocks $502B_0$, $502B_n$. Each sub-block can include multiple physical pages, each page including multiple memory cells 504. Although illustrated herein as having two blocks, each block having two sub-blocks, and each sub-block having multiple memory cells 504, in other examples, the memory array 502 can include more or fewer blocks, sub-blocks, memory cells, etc. In other examples, the memory cells 504 can be arranged in multiple rows, columns, pages, sub-blocks, blocks, etc., and accessed using, for example, access lines 506, first data lines 510, or one or more select gates, source lines, etc.

The memory control unit 530 can control memory operations of the storage system 500 according to one or more signals or instructions received on control lines 532, including, for example, one or more clock signals or control signals that indicate a desired operation (e.g., write, read, erase, etc.), or address signals (A0-AX) received on one or more address lines 516. One or more devices external to the storage system 500 can control the values of the control signals on the control lines 532, or the address signals on the address line 516. Examples of devices external to the storage system 500 can include, but are not limited to, a host, a memory controller, a processor, or one or more circuits or components not illustrated in FIG. 5.

The storage system 500 can use access lines 506 and first data lines 510 to transfer data to (e.g., write or erase) or from (e.g., read) one or more of the memory cells 504. The row decoder 512 and the column decoder 514 can receive and decode the address signals (A0-AX) from the address line 516, can determine which of the memory cells 504 are to be accessed, and can provide signals to one or more of the access lines 506 (e.g., one or more of a plurality of word lines (WL0-WLm)) or the first data lines 510 (e.g., one or more of a plurality of bit lines (BL0-BLn)), such as described above.

The storage system 500 can include sense circuitry, such as the sense amplifiers 520, configured to determine the values of data on (e.g., read), or to determine the values of data to be written to, the memory cells 504 using the first data lines 510. For example, in a selected string of memory cells 504, one or more of the sense amplifiers 520 can read a logic level in the selected memory cell 504 in response to a read current flowing in the memory array 502 through the selected string to the data lines 510.

One or more devices external to the storage system 500 can communicate with the storage system 500 using the I/O lines (DQ0-DQN) 508, address lines 516 (A0-AX), or control lines 532. The input/output (I/O) circuit 526 can transfer values of data in or out of the storage system 500, such as in or out of the page buffer 522 or the memory array 502, using the I/O lines 508, according to, for example, the control lines 532 and address lines 516. The page buffer 522 can store data received from the one or more devices external to the storage system 500 before the data is programmed into relevant portions of the memory array 502, or can store data read from the memory array 502 before the data is transmitted to the one or more devices external to the storage system 500.

The column decoder 514 can receive and decode address signals (A0-AX) into one or more column select signals (CSEL1-CSELn). The selector 524 (e.g., a select circuit) can receive the column select signals (CSEL1-CSELn) and select data in the page buffer 522 representing values of data to be read from or to be programmed into memory cells 504. Selected data can be transferred between the page buffer 522 and the I/O circuit 526 using second data lines 518.

The memory control unit 530 can receive positive and negative supply signals, such as a supply voltage (Vcc) 534 and a negative supply (Vss) 536 (e.g., a ground potential), from an external source or supply (e.g., an internal or external battery, an AC-to-DC converter, etc.). In certain examples, the memory control unit 530 can include a regulator 528 to internally provide positive or negative supply signals.

Figure 6:
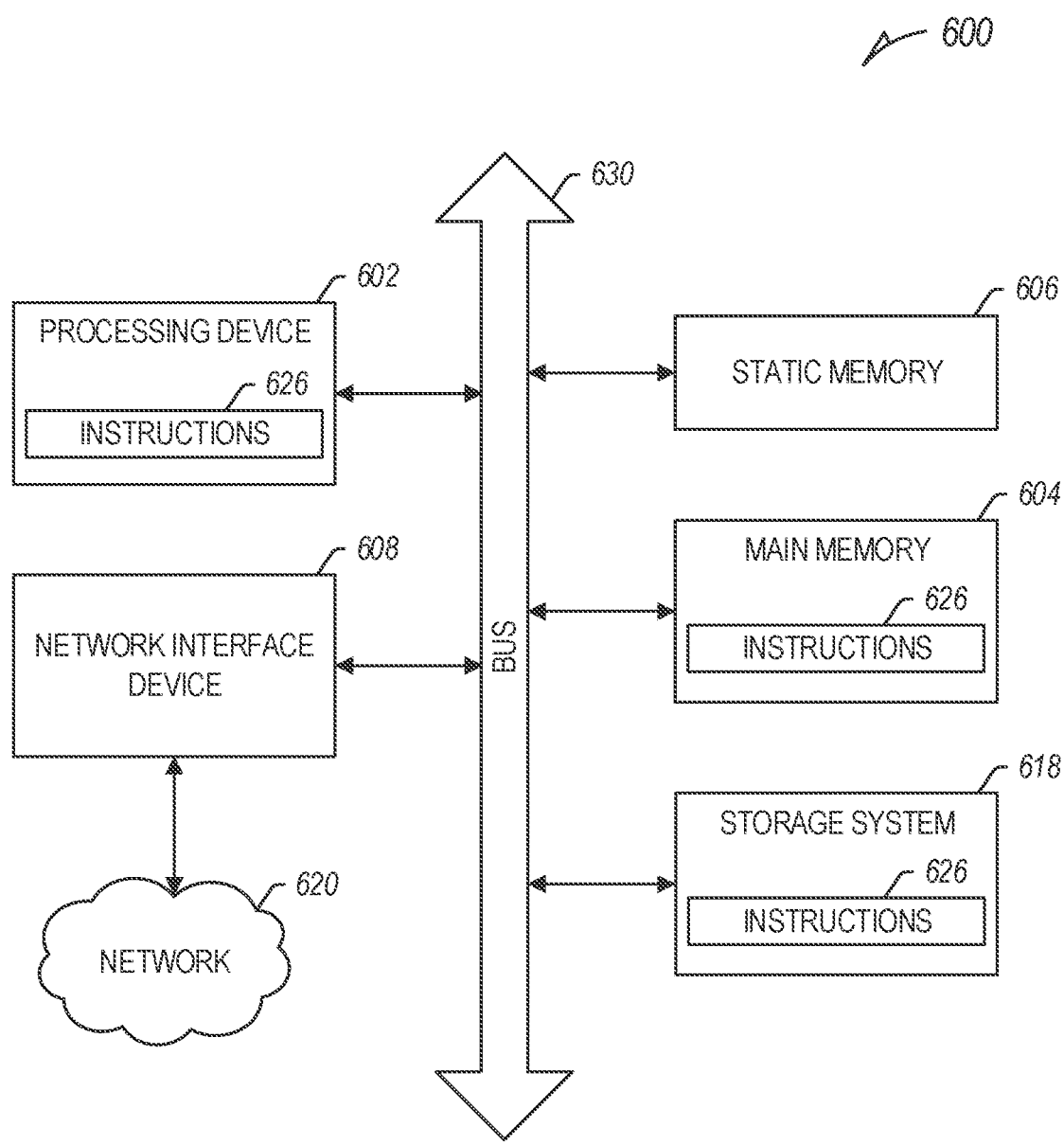
FIG. 6 illustrates a block diagram of an example machine upon which any one or more of the techniques (e.g., methodologies) discussed herein may perform.

FIG. 6 illustrates a block diagram of an example machine (e.g., a host system) 600 upon which any one or more of the techniques (e.g., methodologies) discussed herein may perform (e.g., such as those described in FIG. 1, etc.). In alternative embodiments, the machine 600 may operate as a standalone device or may be connected (e.g., networked) to other machines. In a networked deployment, the machine 600 may operate in the capacity of a server machine, a client machine, or both in server-client network environments. In an example, the machine 600 may act as a peer machine in peer-to-peer (P2P) (or other distributed) network environment. The machine 600 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system, a host system, etc.) 600 may include a processing device 602 (e.g., a hardware processor, a central processing unit (CPU), a graphics processing unit (GPU), a hardware processor core, or any combination thereof, etc.), a main memory 604 (e.g., read-only memory (ROM), dynamic random-access memory (DRAM) such as synchronous DRAM (SDRAM) or Rambus DRAM (RDRAM), etc.), a static memory 606 (e.g., static random-access memory (SRAM), etc.), and a storage system 618, some or all of which may communicate with each other via a communication interface (e.g., a bus) 630.

The processing device 602 can represent one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 602 can also be one or more special-purpose processing devices such as an application specific integrated circuit (ASIC), a field programmable gate array (FPGA), a digital signal processor (DSP), network processor, or the like. The processing device 602 can be configured to execute instructions 626 for performing the operations and steps discussed herein. The computer system 600 can further include a network interface device 608 to communicate over a network 620.

The storage system 618 can include a machine-readable storage medium (also known as a computer-readable medium) on which is stored one or more sets of instructions 626 or software embodying any one or more of the methodologies or functions described herein. The instructions 626 can also reside, completely or at least partially, within the main memory 604 or within the processing device 602 during execution thereof by the computer system 600, the main memory 604 and the processing device 602 also constituting machine-readable storage media.

The term "machine-readable storage medium" should be taken to include a single medium or multiple media that store the one or more sets of instructions, or any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The machine 600 may further include a display unit, an alphanumeric input device (e.g., a keyboard), and a user interface (UI) navigation device (e.g., a mouse). In an example, one or more of the display unit, the input device, or the UI navigation device may be a touch screen display. The machine a signal generation device (e.g., a speaker), or one or more sensors, such as a global positioning system (GPS) sensor, compass, accelerometer, or one or more other sensor. The machine 600 may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The instructions 626 (e.g., software, programs, an operating system (OS), etc.) or other data are stored on the storage system 618 can be accessed by the main memory 604 for use by the processing device 602. The main memory 604 (e.g., DRAM) is typically fast, but volatile, and thus a different type of storage than the storage system 618 (e.g., an SSD), which is suitable for long-term storage, including while in an "off" condition. The instructions 626 or data in use by a user or the machine 600 are typically loaded in the main memory 604 for use by the processing device 602. When the main memory 604 is full, virtual space from the storage system 618 can be allocated to supplement the main memory 604; however, because the storage system 618 device is typically slower than the main memory 604, and write speeds are typically at least twice as slow as read speeds, use of virtual memory can greatly reduce user experience due to storage system latency (in contrast to the main memory 604, e.g., DRAM). Further, use of the storage system 618 for virtual memory can greatly reduce the usable lifespan of the storage system 618.

The instructions 624 may further be transmitted or received over a network 620 using a transmission medium via the network interface device 608 utilizing any one of multiple transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 608 may include one or more physical jacks (e.g., Ethernet, coaxial, or phone jacks) or one or more antennas to connect to the network 620. In an example, the network interface device 608 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 600, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" may include "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended. A system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

Operating a memory cell, as used herein, includes reading from, writing to, or erasing the memory cell. The operation of placing a memory cell in an intended state is referred to herein as "programming," and can include both writing to or erasing from the memory cell (e.g., the memory cell may be programmed to an erased state).

According to one or more embodiments of the present disclosure, a memory controller (e.g., a processor, controller, firmware, etc.) located internal or external to a storage system, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the storage system as they occur, tracking the operations of the storage system it initiates, evaluating the storage system characteristics corresponding to a wear state, etc.)

According to one or more embodiments of the present disclosure, a memory access device may be configured to provide wear cycle information to the storage system with each memory operation. The storage system control circuitry (e.g., control logic) may be programmed to compensate for storage system performance changes corresponding to the wear cycle information. The storage system may receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine, device, or computer-implemented at least in part. Some examples can include a computer-readable medium, a device-readable medium, or a machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact discs and digital video disks), magnetic cassettes, memory cards or sticks, random access memories (RAMs), read only memories (ROMs), solid state drives (SSDs), Universal Flash Storage (UFS) device, embedded MMC (eMMC) device, and the like.

Example 1 is a system comprising: a storage system comprising control circuitry and a memory array having multiple groups of memory cells, wherein the control circuitry is configured to maintain a relationship between a logical block address (LBA) and a physical address (PA) of data stored on the memory array in a logical-to-physical (L2P) data structure, to maintain a status of the groups of memory cells in a group data structure, wherein the control circuitry, when resuming operation from a low-power state, is configured to: determine if a group of memory cells has an error rate above a stable threshold; and in response to determining that the group of memory cells has an error rate above the stable threshold: assign the determined group of memory cells as a marginal group of memory cells; relocate the assigned marginal group of memory cells; and rebuild the L2P data structure subsequent to relocating the assigned marginal group of memory cells.

In Example 2, the subject matter of Example 1 optionally includes wherein resuming operation from the low-power state comprises resuming operation from an asynchronous power loss (APL), and wherein, to rebuild the L2P data structure comprises to rebuild the L2P data structure in response to the APL.

In Example 3, the subject matter of any one or more of Examples 1-2 optionally include wherein the control circuitry is configured to: determine the last written group of memory cells in the group data structure; and in response to determining that the last written group of memory cells has an error rate above the stable threshold: assign the last written group of memory cells as a marginal group of memory cells; relocate the assigned marginal group of memory cells; and rebuild the L2P data structure subsequent to relocating the assigned marginal group of memory cells.

In Example 4, the subject matter of Example 3 optionally includes wherein a group of memory cells comprises a page of memory cells.

In Example 5, the subject matter of any one or more of Examples 1-4 optionally include P data structure and the group data structure, and wherein, to determine if the group of memory cells has an error rate above the stable threshold, the control circuitry is configured to determine if a group of memory cells programmed after the synchronization point has an error rate above the stable threshold.

In Example 6, the subject matter of Example 5 optionally includes wherein to determine if the group of memory cells programmed after the synchronization point has an error rate above the stable threshold does not comprise determining that the group of memory cells is correctable or above or below a maximum error threshold separate from the stable threshold.

In Example 7, the subject matter of any one or more of Examples 5-6 optionally include wherein, to determine if one or more of the groups of memory cells programmed after the synchronization point have an error rate above the stable threshold, the control circuitry is configured to: determine if one or more of the groups of memory cells programmed after the synchronization point are not well programmed groups of memory cells having an error rate above the stable threshold.

In Example 8, the subject matter of Example 7 optionally includes wherein the multiple groups of memory cells include multiple pages of memory cells, and wherein, to determine if the one or more pages of memory cells programmed after the synchronization point are not well programmed pages of memory cells, the control circuitry is configured to determine if the one or more pages of memory cells are one of: a marginal group of memory cells having one or more errors but correctable and below the maximum error threshold; or a fake programmed page having errors above the maximum error threshold.

In Example 9, the subject matter of any one or more of Examples 7-8 optionally include wherein the multiple groups of memory cells include multiple pages of memory cells, and wherein, to determine if the one or more pages of memory cells programmed after the synchronization point are not well programmed pages of memory cells, the control circuitry is configured to determine if the one or more pages of memory cells are one of: a marginal group of memory cells having one or more errors but correctable and below the maximum error threshold; a fake programmed page having errors above the maximum error threshold; or a fake erase page where an erase operation was not completed.

Example 10 is a method comprising: maintaining, using control circuitry of a storage system comprising a memory array having multiple groups of memory cells: a relationship between a logical block address (LBA) and a physical address (PA) of data stored on the memory array in a logical-to-physical (L2P) data structure; and a status of multiple groups of memory cells of the memory array in a group data structure; determining, using the control circuitry when resuming operation from a low-power state, if a group of memory cells has an error rate above a stable threshold; and in response to determining that the group of memory cells has an error rate above the stable threshold, using the control circuitry: assigning the determined group of memory cells as a marginal group of memory cells; relocating the assigned marginal group of memory cells; and rebuilding the L2P data structure subsequent to relocating the assigned marginal group of memory cells.

In Example 11, the subject matter of Example 10 optionally includes wherein resuming operation from the low-power state comprises resuming operation from an asynchronous power loss (APL), and wherein rebuilding the L2P data structure comprises rebuilding the L2P data structure in response to the APL.

In Example 12, the subject matter of any one or more of Examples 10-11 optionally include determining, using the control circuitry, the last written group of memory cells in the group data structure, wherein determining if the group of memory cells has an error rate above the stable threshold comprises determining if the last written group of memory cells in the group data structure has an error rate above the stable threshold; and in response to determining that the last written group of memory cells has an error rate above the stable threshold: assigning the last written group of memory cells as a marginal group of memory cells; relocating the assigned marginal group of memory cells; and rebuilding the L2P data structure subsequent to relocating the assigned marginal group of memory cells.

In Example 13, the subject matter of any one or more of Examples 10-12 optionally include storing, using the control circuitry, a synchronization point between the L2P data structure and the group data structure, wherein determining if the group of memory cells has an error rate above the stable threshold comprises determining if a group of memory cells programmed after the synchronization point has an error rate above the stable threshold.

In Example 14, the subject matter of Example 13 optionally includes wherein determining if the group of memory cells programmed after the synchronization point has an error rate above the stable threshold does not comprise determining that the group of memory cells is correctable or above or below a maximum error threshold separate from the stable threshold.

In Example 15, the subject matter of any one or more of Examples 13-14 optionally include wherein determining if one or more of the groups of memory cells programmed after the synchronization point have an error rate above the stable threshold comprises determining if one or more of the groups of memory cells programmed after the synchronization point are not well programmed groups of memory cells having an error rate above the stable threshold.

Example 16 is at least one non-transitory device-readable storage medium comprising instructions that, when executed by a control circuitry of a storage system, cause the control circuitry to perform operations comprising: maintaining a relationship between a logical block address (LBA) and a physical address (PA) of data stored on a memory array of the storage system in a logical-to-physical (L2P) data structure; maintaining a status of multiple groups of memory cells of the memory array in a group data structure; determining, when resuming operation from a low-power state, if a group of memory cells has an error rate above a stable threshold; and in response to determining that the group of memory cells has an error rate above the stable threshold: assigning the determined group of memory cells as a marginal group of memory cells; relocating the assigned marginal group of memory cells; and rebuilding the L2P data structure subsequent to relocating the assigned marginal group of memory cells.

In Example 17, the subject matter of Example 16 optionally includes wherein resuming operation from the low-power state comprises resuming operation from an asynchronous power loss (APL), and wherein rebuilding the L2P data structure comprises rebuilding the L2P data structure in response to the APL.

In Example 18, the subject matter of any one or more of Examples 16-17 optionally include wherein the operations comprise: determining a last written group of memory cells in the group data structure, wherein determining if the group of memory cells has an error rate above the stable threshold comprises determining if the last written group of memory cells in the group data structure has an error rate above the stable threshold.

In Example 19, the subject matter of any one or more of Examples 16-18 optionally include wherein the operations comprise: storing a synchronization point between the L2P data structure and the group data structure, wherein determining if the group of memory cells has an error rate above the stable threshold comprises determining if a group of memory cells programmed after the synchronization point has an error rate above the stable threshold.

In Example 20, the subject matter of Example 19 optionally includes wherein determining if the group of memory cells programmed after the synchronization point has an error rate above the stable threshold does not comprise determining that the group of memory cells is correctable or above or below a maximum error threshold separate from the stable threshold.

In Example 21, the subject matter of any one or more of Examples 19-20 optionally include wherein determining if one or more of the groups of memory cells programmed after the synchronization point have an error rate above the stable threshold comprises determining if one or more of the groups of memory cells programmed after the synchronization point are not well programmed groups of memory cells having an error rate above the stable threshold.

In Example 22, subject matter (e.g., a system or apparatus) may optionally combine any portion or combination of any portion of any one or more of Examples 1-21 to comprise "means for" performing any portion of any one or more of the functions or methods of Examples 1-21, or at least one "non-transitory machine-readable medium" including instructions that, when performed by a machine, cause the machine to perform any portion of any one or more of the functions or methods of Examples 1-21.

The above description is intended to be illustrative, and not restrictive. For example, the above-described examples (or one or more aspects thereof) may be used in combination with each other. Other embodiments can be used, such as by one of ordinary skill in the art upon reviewing the above description. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A system comprising:
a storage system comprising control circuitry and a memory array having multiple groups of memory cells, wherein the control circuitry is configured to maintain a relationship between a logical block address (LBA) and a physical address (PA) of data stored on the memory array in a logical-to-physical (L2P) data structure and store a synchronization point indicating a specific point where data operations on the memory array are complete and the L2P data is updated and stored, and
wherein the control circuitry, when resuming operation from a low-power state, is configured to:
determine an error rate of one or more groups of memory cells programmed or erased subsequent to the synchronization point;
relocate groups of memory cells having an error rate above a stable threshold;
rebuild the L2P data structure subsequent to relocating the groups of memory cells having the error rate above the stable threshold;
update the synchronization point subsequent to rebuilding the L2P data structure; and
transition from resuming operation from the low-power state to in operation subsequent to updating the synchronization point,
wherein the stable threshold is below and separate from a maximum error threshold, wherein the maximum error threshold is a threshold above which the system is not configured to correct errors in the group of memory cells.

2. The system of claim 1,
wherein resuming operation from the low-power state comprises resuming operation from an asynchronous power loss (APL), and
wherein, to rebuild the L2P data structure comprises to rebuild the L2P data structure in response to the APL.

3. The system of claim 1,
wherein the control circuitry is configured to determine the last written group of memory cells in the group data structure programmed before resuming operation from the low power state, and
wherein to determine the error rate of one or more groups of memory cells programmed or erased subsequent to the synchronization point comprises:
to determine an error rate of the last written group of memory cells in the group data structure.

4. The system of claim 3,
wherein, in response to determining that the error rate of the last written group of memory cells is above the stable threshold, the control circuitry is configured to:
relocate the last written group of memory cells; and
rebuild the L2P data structure subsequent to relocating the last written group of memory cells.

5. The system of claim 4,
wherein, in response to determining that the error rate of the last written group of memory cells is above the stable threshold, the control circuitry is configured to:
mark all groups of memory cells programmed or erased between the synchronization point and the last group of memory cells programmed before resuming operation from the low-power state as valid in a group data structure.

6. The system of claim 5,
wherein the control circuitry is configured to mark all groups of memory cells programmed or erased between the synchronization point and the last group of memory cells programmed before resuming operation from the low-power state as valid prior to rebuilding the L2P data structure.

7. The system of claim 4,
wherein, in response to determining that the error rate of the last written group of memory cells is above the stable threshold, the control circuitry is configured to:
update the synchronization point subsequent to rebuilding the L2P data structure; and
transition from resuming operation from the low-power state to in operation subsequent to updating the synchronization point.

8. The system of claim 1, wherein a group of memory cells comprises a page of memory cells.

9. The system of claim 1, wherein the stable threshold is between 20% and 50% below the maximum error threshold.

10. A system comprising:
a storage system comprising control circuitry and a memory array having multiple groups of memory cells,
wherein the control circuitry is configured to maintain a relationship between a logical block address (LBA) and a physical address (PA) of data stored on the memory array in a logical-to-physical (L2P) data structure and store a synchronization point indicating a specific point where data operations on the memory array are complete and the L2P data is updated and stored, and
wherein the control circuitry, when resuming operation from a low-power state, is configured to:
determine if the last group of memory cells programmed before resuming operation from the low-power state is the synchronization point; and
in response to determining that the last group of memory cells programmed before resuming operation from the low-power state is not the synchronization point:
determine an error rate of the last group of memory cells programmed before resuming operation from the low-power state; and
if the error rate of the last group of memory cells programmed before resuming operation from the low-power state is below a threshold:
rebuild the L2P data structure;
update the synchronization point subsequent to rebuilding the L2P data structure; and
transition from resuming operation from the low-power state to in operation subsequent to updating the synchronization point,
wherein the stable threshold is below and separate from a maximum error threshold, wherein the maximum error threshold is a threshold above which the system is not configured to correct errors in the group of memory cells.

11. The system of claim 10,
wherein, if the error rate of the last group of memory cells programmed before resuming operation from the low power state is below the threshold, the control circuitry is configured to:
mark all groups of memory cells programmed or erased between the synchronization point and the last group of memory cells programmed before resuming operation from the low-power state as valid in a group data structure.

12. The system of claim 11,
wherein the control circuitry is configured to mark all groups of memory cells programmed or erased between the synchronization point and the last group of memory cells programmed before resuming operation from the low-power state as valid prior to rebuilding the L2P data structure.

13. The system of claim 10,
wherein resuming operation from the low-power state comprises resuming operation from an asynchronous power loss (APL), and
wherein, to rebuild the L2P data structure comprises to rebuild the L2P data structure in response to the APL.

14. The system of claim 10, wherein a group of memory cells comprises a page of memory cells.

15. The system of claim 10, wherein the stable threshold is between 20% and 50% below the maximum error threshold.

16. A method comprising:
maintaining, using control circuitry of a storage system comprising a memory array having multiple groups of memory cells:
a relationship between a logical block address (LBA) and a physical address (PA) of data stored on a memory array of the storage system in a logical-to-physical (L2P) data structure; and
a synchronization point indicating a specific point where data operations on the memory array are complete and the L2P data is updated and stored; and
determining, using the control circuitry when resuming operation from a low-power state, an error rate of one or more groups of memory cells of the memory array programmed or erased subsequent to the synchronization point;
in response to determining that the error rate of the one or more groups of memory cells are above the stable threshold, using the control circuitry:
relocating groups of memory cells having an error rate above a stable threshold;
rebuilding the L2P data structure subsequent to relocating the groups of memory cells having the error rate above the stable threshold;
updating the synchronization point subsequent to rebuilding the L2P data structure; and
transitioning from resuming operation from the low-power state to in operation subsequent to updating the synchronization point,
wherein the stable threshold is below and separate from a maximum error threshold, wherein the maximum error threshold is a threshold above which the system is not configured to correct errors in the group of memory cells.

17. The method of claim 16,
wherein resuming operation from the low-power state comprises resuming operation from an asynchronous power loss (APL), and
wherein rebuilding the L2P data structure comprises in response to the APL.

18. The method of claim 16, comprising:
determining, using the control circuitry, the last written group of memory cells in the group data structure programmed before resuming operation from the low power state,
wherein determining the error rate of the one or more groups of memory cells programmed or erased subsequent to the synchronization point comprises:
determining an error rate of the last written group of memory cells in the group data structure; and
in response to determining that the error rate of the last written group of memory cells is above the stable threshold:
marking all groups of memory cells programmed or erased between the synchronization point and the last group of memory cells programmed before resuming operation from the low-power state as valid in a group data structure;
relocating the last written group of memory cells; and
rebuilding the L2P data structure subsequent to relocating the last written group of memory cells;
update the synchronization point subsequent to rebuilding the L2P data structure; and
transition from resuming operation from the low-power state to in operation subsequent to updating the synchronization point.

19. The method of claim 16, wherein the stable threshold is between 20% and 50% below the maximum error threshold.

20. The method of claim 16, wherein a group of memory cells comprises a page of memory cells.

* * * * *